(12) United States Patent
Ferrara

(10) Patent No.: US 11,670,483 B2
(45) Date of Patent: Jun. 6, 2023

(54) HIGH POWER WAFER COOLING

(71) Applicant: Axcelis Technologies, Inc., Beverly, MA (US)

(72) Inventor: Joseph Ferrara, Georgetown, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 208 days.

(21) Appl. No.: 16/860,386

(22) Filed: Apr. 28, 2020

(65) Prior Publication Data
US 2020/0350139 A1 Nov. 5, 2020

Related U.S. Application Data

(60) Provisional application No. 62/841,272, filed on May 1, 2019.

(51) Int. Cl.
*H01J 37/31* (2006.01)
*H01J 37/317* (2006.01)
(Continued)

(52) U.S. Cl.
CPC .......... *H01J 37/3171* (2013.01); *H01J 27/02* (2013.01); *H01J 37/3244* (2013.01);
(Continued)

(58) Field of Classification Search
CPC ........ H01J 27/02; H01J 37/08; H01J 37/3171; H01J 2237/31749; H01J 37/32422;
(Continued)

(56) References Cited

U.S. PATENT DOCUMENTS 4,261,762 A 4/1981 King
6,179,921 B1 1/2001 Ruffell
(Continued)

FOREIGN PATENT DOCUMENTS

WO 8906711 A1 7/1989

OTHER PUBLICATIONS

Stanchina, Willam; "Calcia-Stabilized Zirconia Solid Electrolyte Cells as Oxygen Sensors for III-V Semiconductor Processings"; Proceedings of the National Electronics Conference. Jan. 1, 1989.
(Continued)

*Primary Examiner* — Rudy Zervigon
(74) *Attorney, Agent, or Firm* — Eschweiler & Potashnik, LLC

(57) ABSTRACT

A gas generation system for an ion implantation system has a hydrogen generator configured to generate hydrogen gas within an enclosure. A chuck, such as an electrostatic chuck, supports a workpiece in an end station of the ion implantation system, and a delivery system provides the hydrogen gas to the chuck. The hydrogen gas can be provided through the chuck to a backside of the workpiece. Sensors can detect a presence of the hydrogen gas within the enclosure. A controller can control the hydrogen generator. An exhaust system can pass air through the enclosure to prevent a build-up of the hydrogen gas within the enclosure. A purge gas system provides a dilutant gas to the enclosure. An interlock system can control the hydrogen generator, delivery system, purge gas system, and exhaust system to mitigate hydrogen release based on a signal from the one or more sensors.

20 Claims, 4 Drawing Sheets

(51) Int. Cl.
*H01J 37/32* (2006.01)
*H01L 21/683* (2006.01)
*H01J 27/02* (2006.01)
*C23C 16/48* (2006.01)
*C23C 14/48* (2006.01)

(52) U.S. Cl.
CPC .......... *H01L 21/6833* (2013.01); *C23C 14/48* (2013.01); *C23C 16/486* (2013.01); *H01J 37/32412* (2013.01); *H01J 2237/049* (2013.01); *H01J 2237/2001* (2013.01); *H01J 2237/31749* (2013.01)

(58) Field of Classification Search
CPC .......... H01J 2237/049; H01J 2237/057; H01J 2237/2001; H01J 37/26; H01J 2237/303; H01J 37/30; H01J 37/32412; H01L 21/3065; H01L 21/30604; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745; C23C 16/48; C23C 14/48; C23C 16/486; C23C 16/54; C23C 16/45551; C23C 16/545; C23C 16/4412; C23C 14/568; C23C 16/4401
USPC ............. 118/724, 728, 719, 723 CB, 723 FI; 156/345.51, 345.52, 345.53, 345.31, 156/345.32, 345.39, 345.4
See application file for complete search history.

(56) References Cited

U.S. PATENT DOCUMENTS

| 8,101,488 | B1 | 1/2012 | Smick | |
|---|---|---|---|---|
| 9,096,939 | B2 | 8/2015 | Mishra | |
| 2004/0079289 | A1* | 4/2004 | Kellerman | ........ H01L 21/67109 118/728 |
| 2011/0286913 | A1* | 11/2011 | Lugtigheid | .............. B67D 7/04 423/658.2 |
| 2018/0269033 | A1* | 9/2018 | Sinclair | ............... H01J 37/3171 |

OTHER PUBLICATIONS

International Search Report and Written Opinion dated Aug. 3, 2020 in connection with International Application No. PCT/US2020/030749.

* cited by examiner

HIGH POWER WAFER COOLING

REFERENCE TO RELATED APPLICATIONS

This application claims the benefit of U.S. Provisional Application No. 62/841,272 filed May 1, 2019, entitled "HIGH POWER WAFER COOLING", the contents of which are herein incorporated by reference in their entirety.

TECHNICAL FIELD

The present invention relates generally to ion implantation systems, and more specifically to an ion implantation system having a hydrogen generator for a workpiece support of the ion implantation system.

BACKGROUND

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot implants, where process temperatures at the workpiece are maintained at high temperatures typically ranging from 100-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, are becoming more common, whereby the process temperature is typically achieved via a dedicated high temperature electrostatic chuck (ESC), also called a heated chuck. The heated chuck holds or clamps the workpiece to a surface thereof during implantation. A conventional high temperature ESC, for example, comprises a set of heaters embedded under the clamping surface for heating the ESC and workpiece to the process temperature (e.g., 100° C.-600° C.), whereby a gas interface conventionally provides a thermal interface from the clamping surface to the backside of the workpiece. Typically, a high temperature ESC is cooled through radiation of energy to the chamber surfaces in the background.

Chilled ion implantation processes are also common, where conventionally, a room temperature workpiece is placed on a chilled chuck, and the chilled chuck is cooled to a chilled temperature (e.g., a temperature below room temperature), thereby cooling the workpiece. Cooling the chilled chuck provides for a removal of thermal energy imparted into the workpiece from the ion implantation, while further maintaining the chuck and workpiece at the chilled temperature during the implant via the removal of heat through the chilled chuck.

Ion implantation processes are also performed at so-called "quasi-room temperature" (e.g., a temperature slightly elevated above room temperature, such as at 50-60° C., but not as high as a hot ion implantation process), whereby a low-heat chuck (e.g., a chuck configured to heat to a temperature less than 100° C.) has been used to control the temperature of the workpiece during implantation.

SUMMARY

The following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

In accordance with another exemplified aspect, a gas generation system for an ion implantation system is provided. The gas generation system, in accordance with one example, comprises a chuck for supporting a workpiece in an end station of the ion implantation system, a hydrogen generator configured to generate hydrogen gas, a delivery system configured to provide the hydrogen gas to the chuck, and an enclosure configured to generally enclose the hydrogen generator. The chuck, for example, comprises an electrostatic chuck configured to provide the hydrogen gas to a backside of the workpiece.

According to another example, one or more sensors are provided and associated with the enclosure. The one or more sensors, for example, comprise a hydrogen sensor configured to detect a presence of the hydrogen gas within the enclosure. The hydrogen sensor, for example, is configured to detect an elevated presence of hydrogen that rises a predetermined threshold value.

According to another example, an exhaust system is configured to fluidly interface with the enclosure. The exhaust system, for example, is configured to selectively or continuously pass air or another gas through the enclosure to generally prevent a build-up of the hydrogen gas within the enclosure. A purge gas system may be further configured to fluidly interface with the enclosure. The purge gas system, for example, is configured to provide a dilutant gas to the enclosure. The dilutant gas, for example, comprises one or more nitrogen, air, a non-flammable gas, and a low flammability gas. In another example, the purge gas system is configured to dilute a concentration of the hydrogen gas to below an explosive level.

In accordance with another example, an interlock system is provided and configured to control one or more of the hydrogen generator, the delivery system, a purge gas system, and an exhaust system to mitigate hydrogen release. The control via the interlock system, for example, is based, at least in part, on a signal from the one or more sensors. The interlock system, for example, comprises one or more automated valves, switches, or other interlocks. For example, the interlock system comprises one or more of a hardware system and a software control system configured to monitor a concentration of hydrogen gas from a signal from the one or more sensors. The interlock system, for example, may be configured to perform one or more of a shut down the generation of hydrogen by the hydrogen generator, an opening of an exhaust system, an opening of a purge gas system, and a provision of a signal to a controller indicative of a hydrogen release when the concentration of hydrogen gas exceeds a predetermined threshold value.

The above summary is merely intended to give a brief overview of some features of some embodiments of the present disclosure, and other embodiments may comprise additional and/or different features than the ones mentioned above. In particular, this summary is not to be construed to be limiting the scope of the present application.

Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
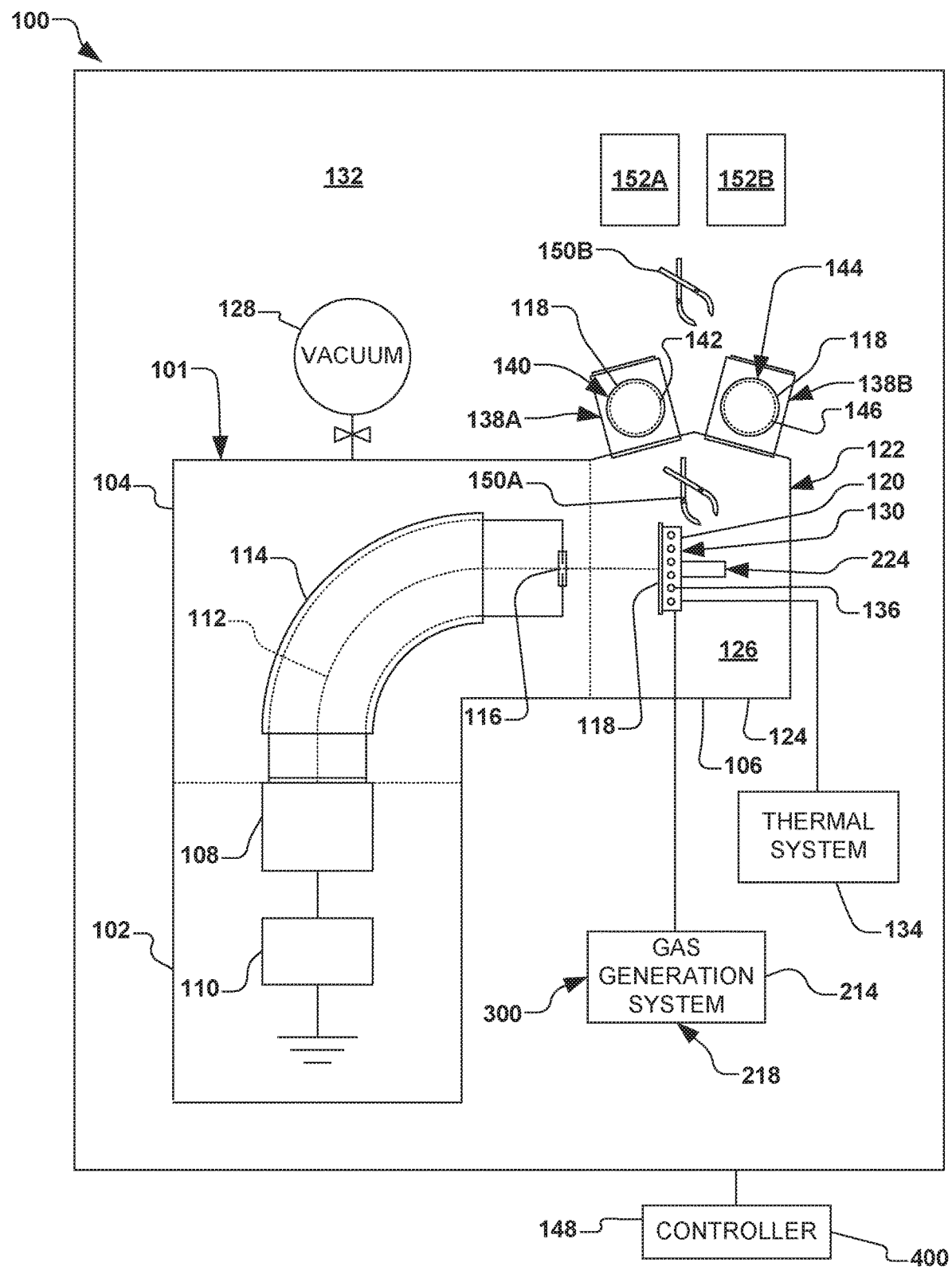
FIG. 1 is a block diagram of an exemplified vacuum system utilizing a hydrogen generator in accordance with several aspects of the present disclosure.

The present disclosure is directed generally toward an ion implantation system and a source for generating hydrogen gas associated therewith. More particularly, the present disclosure is directed toward hydrogen generation components for generating hydrogen for use as a backside gas for a wafer cooling or heat transfer mechanism in an end station of an ion implantation system. The present disclosure positions a hydrogen gas generator in an enclosure associated with the end station, whereby containment and safety aspects of the enclosure advantageously ameliorate explosion concerns associated with conventional gas bottles and gas delivery piping.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Temperature precision and control are having greater and greater import in semiconductor wafer processing. Systems have been provided to measure and control the temperature of a support on which the workpiece resides (e.g., a temperature of an electrostatic chuck), wherein characterization and analytics of the temperature of the support are utilized to indirectly estimate the temperature of the workpiece. This disclosure presently appreciates that such a reliance on the temperature of the workpiece support, however, can lead to temperature errors during processing of the workpiece.

Heated ion implantation processes can heat a workpiece to process temperatures in the range of 100 C-600 C or greater. The process temperature, for example, is, in part, achieved and maintained at an electrostatic chuck that supports the workpiece during implantation. In accordance with various aspects of the present disclosure, FIG. 1 illustrates an exemplified ion implantation system 100. The ion implantation system 100 in the present example comprises an exemplified ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112, whereby the beamline assembly 104 is configured to selectively transport the ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a chuck 120. The chuck 120, for example, may comprise an electrostatic chuck (ESC) or mechanical clamp chuck, wherein the chuck is configured to selectively control a temperature of the workpiece 118. Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplified aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 100-600° C. or greater). Thus, in the present example, the chuck 120 comprises a thermal chuck 130, wherein the thermal chuck is configured to support and retain the workpiece 118 while further heating the workpiece 118 within the process chamber 122 prior to, during, and/or after the exposure of the workpiece to the ion beam 112.

The thermal chuck 130, for example, may comprise an electrostatic chuck (ESC) configured to heat or cool the workpiece 118 to a processing temperature that may be greater than, less than, or equal to an ambient or atmospheric temperature of the surroundings or external environment 132 (e.g., also called an "atmospheric environment"). A thermal system 134 may be further provided, wherein the thermal system is configured to heat or cool the thermal chuck 130 and, in turn, the workpiece 118 residing thereon to the desired processing temperature. The thermal system 134, in one example, is configured to selectively heat or cool the workpiece 118 via one or more thermal features 136 disposed within the thermal chuck 130. The one or more thermal features 136, for example, may comprise one or more heating elements for heating the workpiece 118, and/or one or more cooling elements for cooling the workpiece. In one example, the thermal system 134 comprises a coolant source, whereby the one or more thermal features 136 comprise one or more cooling channels defined in the thermal chuck for flowing a coolant (e.g., water) through the one or more thermal features for cooling of the workpiece 118.

For some high temperature implants, the workpiece 118 may allowed to "soak" on the thermal chuck 130 within the vacuum of the process environment 126 until the desired temperature is reached. Alternatively, in order to increase cycle time through the ion implantation system 100 the workpiece may be pre-heated in one or more chambers 138A, 138B (e.g., one or more load lock chambers) operatively coupled to the process chamber 122 via a pre-heat apparatus 140. The pre-heat apparatus 140, for example, may comprise a pre-heat support 142 configured similar to the thermal chuck 130.

Depending on the tool architecture, process, and desired throughput, the workpiece 118 may be preheated to the first temperature via the pre-heat apparatus 140, wherein the first temperature is equal to or lower than the process temperature, thus allowing for a final thermal equalization on the thermal chuck 130 inside the vacuum chamber 124. Such a scenario allows the workpiece 118 to lose some heat during transfer to the process chamber 122, wherein final heating to the process temperature is performed on the thermal chuck 130. Alternatively, the workpiece 118 may be preheated via the pre-heat apparatus 140 to a first temperature that is higher than the process temperature. Accordingly, the first temperature would be optimized so that cooling of the workpiece 118 during transfer to the process chamber 122 is just enough for the workpiece to be at the desired process temperature as it is clamped onto the thermal chuck 130.

In order to accurately control and/or accelerate the thermal response and enable an additional mechanism for heat transfer, the back side of the workpiece 118 is brought into conductive communication with the thermal chuck 130. This conductive communication is achieved, for example, through a pressure controlled gas interface (also called "back side gas") between the thermal chuck 130 and the workpiece 118. Pressure of the back side gas, for example, is generally limited by the electrostatic force of the thermal chuck 130, and can be generally kept in the range of 5-20 Torr. In one example, the back side gas interface thickness (e.g., the distance between the workpiece 118 and the thermal chuck 130) is controlled on the order of microns (typically 5-20 µm), and as such, the molecular mean free path in this pressure regime becomes large enough for the interface thickness to push the system into the transitional and molecular gas regime.

In accordance with another aspect of the disclosure, chamber 138B comprises a cooling apparatus 144 configured to cool the workpiece when the workpiece 118 is disposed within the chamber 138B subsequent to being implanted with ions during ion implantation. The cooling apparatus 144, for example, may comprise a chilled workpiece support 146, wherein the chilled workpiece support is configured to actively cool the workpiece 118 residing thereon via thermal conduction. The chilled workpiece support 146, for example, comprises a cold plate having a one or more cooling channels passing therethrough, wherein a cooling fluid passing through the cooling channel substantially cools the workpiece 118 residing on a surface of the cold plate. The chilled workpiece support 146 may comprise other cooling mechanisms, such as Peltier coolers or other cooling mechanisms known to one of ordinary skill.

In accordance with another exemplified aspect, a controller 148 is further provided and configured to selectively activate one or more of the thermal system 134, the pre-heat apparatus 140, and the cooling apparatus to selectively heat or cool the workpiece 118 respectively residing thereon. The controller 148, for example, may be configured to heat the workpiece 118 in chamber 138A via the pre-heat apparatus 140, to heat the workpiece to a predetermined temperature in the processing chamber 122 via the thermal chuck 130 and thermal system 134, to implant ions into the workpiece via the ion implantation apparatus 101, to cool the workpiece in chamber 138B via the cooling apparatus 144, and to selectively transfer the workpiece between the external environment 132 and the process environment 126 via one or more workpiece transfer apparatuses 150A, 150B.

In one example, the workpiece 118 may be further delivered to and from the process chamber 122 such that the workpiece is transferred between a selected front opening unified pod (FOUP) 152A, 152B and chambers 138A, 138B via workpiece transfer apparatus 150B, and further transferred between the chambers 138A, 138B and the thermal chuck 130 via workpiece transfer apparatus 150A. The controller 148, for example, is further configured to selectively transfer the workpiece between the FOUPs 152A, 152B, chambers 138A, 138B, and thermal chuck 130 via a control of the workpiece transfer apparatus 150A, 150B.

The system 100 of FIG. 1 of the present disclosure, for example, may further be advantageously configured to perform both high temperature implants (e.g., in the range of 100-600° C.) and quasi-room temperature implants (e.g., in the range of 20-100° C.) while utilizing the same thermal chuck 130. Such a configuration is advantageous over conventional systems in both simplicity, as well as productivity, as the system 100 of FIG. 1 may be utilized in various implantation schemes with minimal changes in configuration while mitigating various deficiencies commonly seen in conventional startup operations of conventional ion implantation systems.

Figure 2:
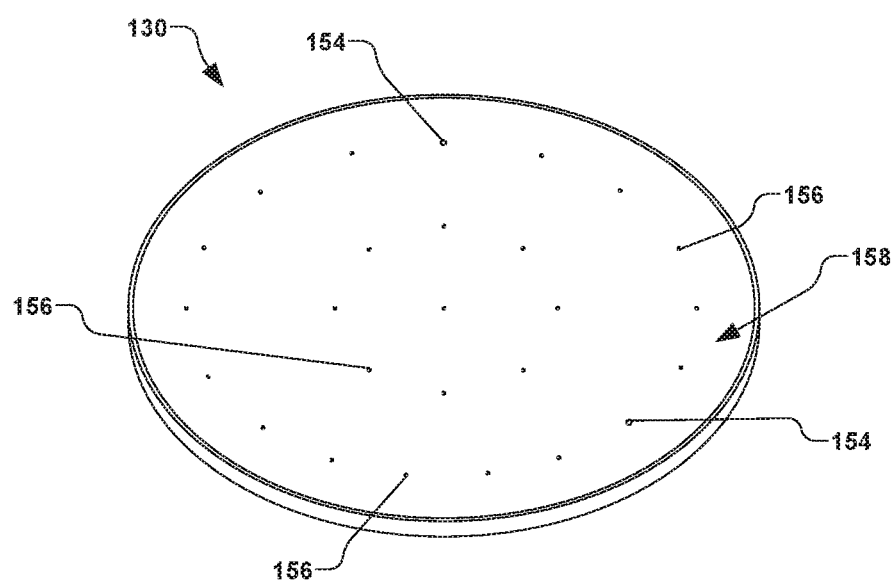
FIG. 2 is a perspective view of a top of a clamping surface of a thermal chuck in accordance with an aspect of the present disclosure.

An exemplified thermal chuck 130 is illustrated in FIG. 2, whereby the thermal chuck, for example, primarily serves two functions; namely, to selectively clamp the workpiece 118 of FIG. 1 thereto, and to heat and/or cool the workpiece. One or more ground pins 154 shown in FIG. 2, for example, are provided for electrical grounding of the workpiece, and a plurality of mesas 156 are provided on a clamping surface 158 of the thermal chuck 130 in order to minimize contact with the workpiece 118 of FIG. 1 and to mitigate particle contamination.

Figure 3:
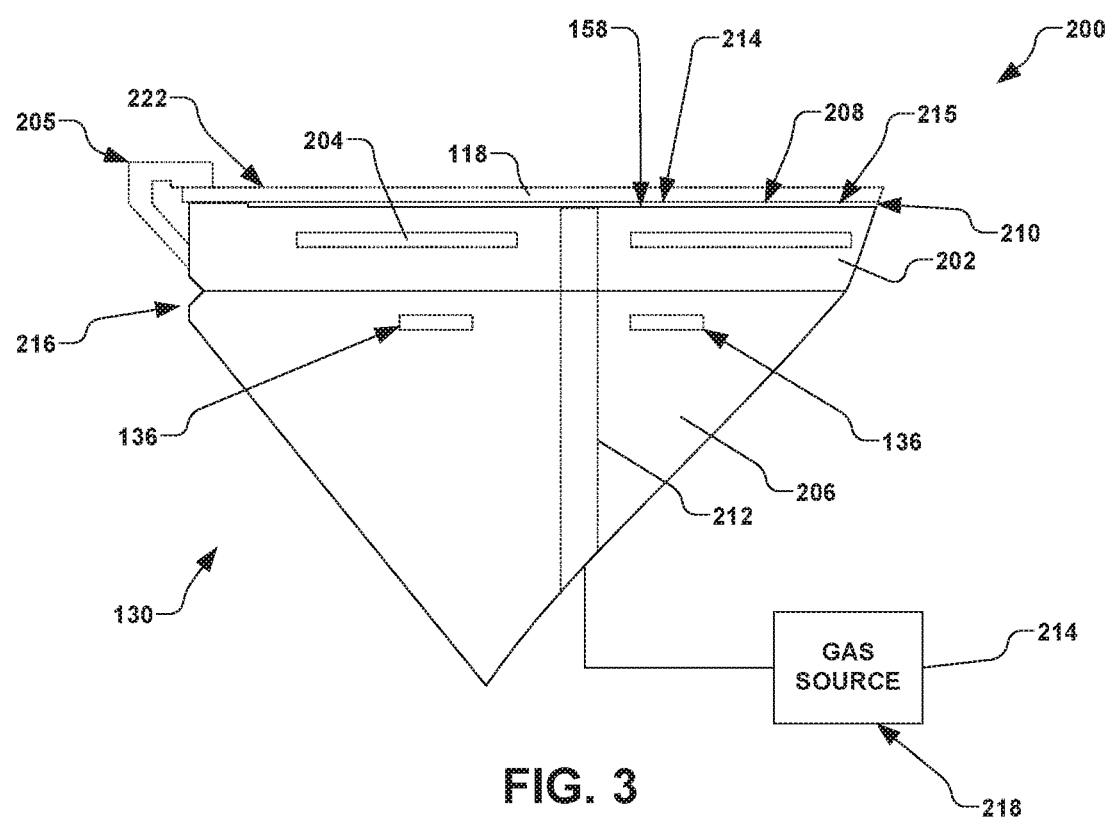
FIG. 3 is a partial cross-sectional view of a thermal chuck in accordance with an aspect of the present disclosure.

In accordance with another exemplified aspect of the disclosure, FIG. 3 illustrates a portion 200 of the thermal chuck 130. For example, a carrier plate 202 is illustrated, whereby the workpiece 118 is selectively clamped to the clamping surface 158 of the thermal chuck 130. In one example, the carrier plate 202 is comprised of a ceramic material having one or more high voltage electrodes 204 embedded therein, or otherwise associated therewith, whereby the one or more high voltage electrodes 204 are configured to electrostatically attract the workpiece 118 to the thermal chuck 130, generally defining an electrostatic chuck (ESC). Alternatively, or in addition, the thermal chuck 130 may comprise one or more mechanical clamping members 205 configured to selectively mechanically clamp the workpiece 118 to the carrier plate 202, whereby the thermal chuck generally defines a mechanical chuck.

In the present example, the one or more thermal features 136 of FIG. 3 comprise one or more cooling channels defined in the thermal chuck 130 and configured to selectively cool the thermal chuck 130. It should be understood that the one or more thermal features 136 may alternatively comprise one or more heaters (not shown) embedded in the thermal chuck 130 for selectively heating the thermal chuck. The controller 148, for example, is configured to selectively control the one or more thermal features 136 to selectively control a thermal condition of the one or more thermal features.

The carrier plate 202 of FIG. 3, for example, may be bonded to or be integral with a thermal plate 206 having the one or more thermal features 136 (e.g., one or more cooling channels or resistive heating elements, etc.) associated therewith. For example, the thermal plate 206 may be comprised of a ceramic material, whereby the one or more thermal features 136 are defined in, or embedded within, the thermal plate. It should be noted that the thermal plate 206 and carrier plate 202 may be separate plates or integrated into one plate. The one or more thermal features 136, for example, can be configured to actively cool, heat, or maintain the temperature of the workpiece 118 of FIG. 1 during an implantation process. The one or more thermal features 136 of FIG. 3, for example, can heat or otherwise maintain the workpiece temperature at various temperatures, as desired.

According to another example, a backside gas (BSG) 208 is provided in a backside gap 210 between the clamping surface 158 of the carrier plate 202 and the workpiece 118 residing thereon in order advantageously transfer heat to or from the workpiece. The backside gas 208, for example, is provided to the backside gap 210 via a conduit 212 operably coupled to a gas source 214. For example, a backside gas layer 215 is defined in the backside gap 210 (e.g., approximately 10 microns) to conduct heat between the one or more thermal features 136 and the workpiece 118 via the backside gas 208 for advantageously providing or maintaining a temperature. For example, the backside gas 208 can conduct heat from the workpiece 118 to the thermal chuck 130 in a cooling mode.

In one example, the ion Implantation system 100 of FIG. 1 is capable of producing beam currents of the ion beam 112 in the range of 25 mA+. Such a beam current, for example, is utilized at both higher energies (e.g., greater than or equal to approximately 120 keV) and at so-called high dose energies (e.g., in the range of 60 keV). In order to take full advantage of the productivity that such beam currents can offer, the thermal chuck 130 can be configured to dissipate the power of the ion beam 112 that is absorbed by the workpiece 118 in order to generally prevent any photoresist which may be on the workpiece from being damaged to the heat involved with such power of the ion beam. For example, is may be desirable to maintain the temperature of the photoresist at less than approximately 90 C. While some chucks are capable of cooling wafers to <90 C with a power from the ion beam 112 being on the order of 1200-1500 W (e.g., beam energy X ROI beam current), it is desirable to increase the cooling capacity of the chuck 130 to greater than or equal to approximately 2500 W to increase the productivity of the ion implantation system 100.

The backside gas 208 of FIG. 3, for example, can be utilized in an electrostatic chuck system for cooling the workpiece 118 by providing a layer of gas (e.g., nitrogen or hydrogen) between the workpiece and the clamping surface 158 of the thermal chuck 130. For example, nitrogen is generally low in cost and has a high availability for use in ion implanters, as well as having non-flammable properties. The backside gas 208, for example, is used to conduct heat that is created in the workpiece 118 from the power of the ion beam 112 to a cooled platen 216 (e.g., the carrier plate 202 and thermal plate 206) of the thermal chuck 130. The rate of heat transfer from the workpiece 118 into the cooled platen 216 of the thermal chuck 130, for example, is a function of the material properties and thickness (e.g., resistances) in the thermal circuit, such as the thermal resistances of the workpiece, the backside gas, the ESC material, the bonding material, the cooling platen, and the cooling fluid. The greatest resistance in the thermal circuit, for example, is generally associated with the backside gas (BSG) 208.

The present disclosure appreciates that a higher level of heat transfer can be achieve if the resistance associated with the BSG 208 could be reduced. Thus, the present disclosure utilizes hydrogen as the BSG 208 instead of nitrogen, as the thermal conductivity of hydrogen is approximately three times higher than that of nitrogen. The use of hydrogen in a manufacturing facility (e.g., a so-called "fab"), however, can be a safety concern, as hydrogen gas is typically provided from a high-pressure gas bottle. In order to mitigate such safety concerns, this present disclosure provides a point-of-use gas generation system 218 within, or in proximity to the end station 106 of FIG. 1, where the thermal chuck 130 (e.g., the electrostatic chuck system) resides. A location of the point-of-use gas generation system 218, for example, may be positioned within the beamline area, external to the beamline area, or remotely located. Accordingly, in various examples, the present disclosure is not limited by the location of the point-of-use gas generation system 218.

For example, the gas generation system 218 may be configured to dissociate water using one or more electrolysis cells that are connected serially. Each electrolysis cell, for example, comprises an anode electrode (e.g., for oxygen production), a cathode electrode (e.g., for hydrogen production), and a diaphragm (e.g., for separation of oxygen and hydrogen). A reservoir, for example, may be configured to store only enough gas (e.g., hydrogen) that is needed for the process, thereby making the gas generation system 218 a safe alternative for applications where the presence of high pressure gas bottles is a concern.

The gas generation system 218 of the present disclosure, for example, may be configured to flow gas at a rate of approximately 10 sccm. In one example, the gas generation system 218 has relatively small storage capacity of approximately 5 psi or less. As such, the gas is not stored at high pressures (e.g., 2000 psi) that are typically associated with the high pressure gas bottles discussed above.

The present disclosure appreciates that power from the ion beam 112 provides a certain amount of ion flux at an associated energy to the workpiece 118, whereby the amount of power or energy applied to the workpiece is based on the flux rate of the ion beam. Further, it is desirable to maintain the amount of power applied to workpiece 118 such that the resulting temperature is below a predetermined threshold (e.g., due material such as photoresist on the workpiece) to prevent damage to the workpiece or any layers disposed thereon.

In order to improve cooling of the workpiece 118 concurrent with implantation of ions (and power) thereto, the present disclosure contemplates the use a different type of backside gas than customarily used. A thermal model of the stacking of the workpiece 118, the backside gas 208 between the workpiece and thermal chuck 130 (e.g., ESC), and the components that constitute the thermal chuck (e.g., the carrier plate 202, thermal plate 206, etc.), for example, shows that the backside gas layer has the highest thermal resistance. Thus, by improving the thermal conductivity of the backside gas layer 215, more power dissipation between the workpiece 118 and the thermal features 136 (e.g., cooling channels) can be achieved, whereby in the case of thermal features being cooling channels, the power and heat may be dissipated to the cooling fluid (e.g., water) that is flowed through the thermal chuck 130.

The present disclosure utilizes hydrogen gas for the BSG 208, as opposed to nitrogen, as hydrogen has a significantly higher thermal conductivity. As such, lower temperatures may be achieved for higher powers that are introduced to the workpiece 118 via the ion beam 112 of FIG. 1. Further, the present disclosure utilizes the gas generation system 218 as the gas source 214, as opposed to a pressurized bottle. As such, various safety concerns associated with the use and storage of pressurized hydrogen bottles (e.g., high volume leakage potentials, and large amounts of potential energy that could lead to fire or explosions, etc.) are ameliorated by the gas generation system 218 providing the hydrogen gas.

For example, if a regulator or valve associated with a conventional pressurized bottle of hydrogen were to malfunction, hydrogen gas would flood the surrounding area, and shutting off the supply of flammable hydrogen gas may be difficult. The gas generation system 218 of the present disclosure, on the other hand, has limited volumetric capacity and flow, and a selective removal of power thereto will be effective to stop the generation of hydrogen gas. Thus, the present disclosure advantageously provides a selective control of the source of the hydrogen, as opposed to a pressurized bottle. The present disclosure further provides the gas generation system 218 in an area of the end station 106. In the present example, the gas generation system 218 may be positioned in the atmospheric environment 132.

Figure 4:
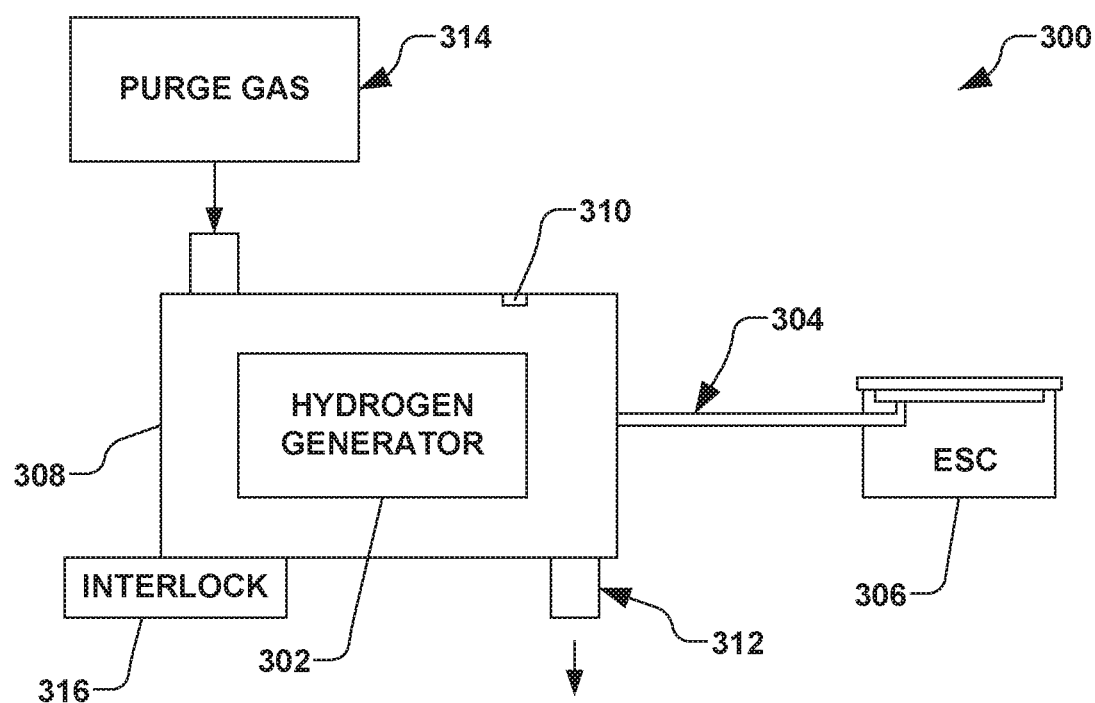
FIG. 4 is a schematic view of an exemplified gas generation system in accordance with another aspect of the disclosure.

In accordance with another example, the gas generation system 218 may comprise a hydrogen generation system 300, as shown further in FIG. 4, whereby various portions of the hydrogen generation system of may be employed in the gas generation system of FIG. 1. The hydrogen generation system 300 of FIG. 4 for example, may comprise one or more sub-systems or components. For example, the exemplified hydrogen generation system 300 illustrated in FIG. 4 comprises a hydrogen generator 302, a delivery system 304 to provide the hydrogen gas to an electrostatic chuck 306, and an enclosure 308 generally enclosing the hydrogen generator 302. One or more sensors 310 may be further provided to detecting a presence of the hydrogen gas within the enclosure 308, whereby the hydrogen sensor is configured to detect an elevated presence of hydrogen that rises a predetermined threshold value.

Further, the hydrogen generation system 300 may comprise an exhaust system 312 that interfaces with the enclosure 308, whereby the exhaust system 312 may be configured to selectively or continuously pass air through the enclosure to generally prevent a build-up of hydrogen gas within the enclosure. A purge gas system 314 may be further provided as interfacing to the enclosure 308, whereby the purge gas system may provide a dilutant gas (e.g., nitrogen, air, or a low flammability gas) to the enclosure. The purge gas system 314, for example, may be configured to provide facility air (e.g., ventilation), room air, a non-flammable gas such as nitrogen, or other source of gas for diluting built-up hydrogen in the enclosure 308. The present disclosure, for example, is thus configured to provide a limited amount of hydrogen (e.g., only as much as needed for BSG), and can dilute the concentration to below an explosive level.

Further, an interlock system 316 (e.g., one or more automated valves, switches, or other interlocks) may be provided to interface with the controller 148 of FIG. 1, whereby the control system, for example, can be configured to control one or more of a generation of hydrogen gas by the hydrogen generator 302, a monitoring of the one or more sensors 310 located in the enclosure 308, and management of the interlock system to mitigate unwanted hydrogen release. The interlock system 316, for example, can comprise a hardware system and/or software control system configured to monitor the concentration of hydrogen from a signal from the one or more sensors 310. For example, when a hydrogen level is detected above a predefined value, the interlock system 316 can be configured to shut down the generation of hydrogen by the hydrogen generator 302, to open the exhaust system 312, to open the purge gas system 314 to quickly dilute the level of hydrogen contained inside the enclosure 308, and/or to provide a signal to the controller 148 of FIG. 1 indicative of a hydrogen release.

The present disclosure, in accordance with another example, further provides engineering controls that may be provided to reduce safety concerns, such that in the event of an unexpected release of hydrogen gas, the concentration of hydrogen gas in the enclosed volume of the enclosure 308 of FIG. 4 can be quickly reduced within the enclosure. The one or more sensors 310 may be provided to provide a signal to take action such as closing of the source of hydrogen flow from the hydrogen generator 302 (e.g., automatic closing of valves), shutting off power to hydrogen generator, or selectively allowing an exhaust flow into or out of the enclosure to increase a flow rate of gas (e.g., air) through the enclosure to dilute or otherwise limit the accumulation of hydrogen gas within the enclosure. Still further, a signal may be provided to the ion implantation system 100 of FIG. 1 as an indication of the status of gas generation system 218.

In one example, the enclosure 308 may be provided around the hydrogen generator 302, whereby the exhaust system 312 comprises an exhaust duct that is selectively fluidly coupled to ventilation associated with the facility in which the ion implantation system 100 of FIG. 1 is located, whereby a flow of ventilation air may be provided around the hydrogen generator. Any hydrogen gas that may leak out of the hydrogen generator 302, for example, may be confined in the enclosure 308 and/or exhausted. The exhaust system 312, for example, can be configured to continuously pull air out of, or through, the enclosure 308 through a vent or other means, such that negative pressure is generally not induced in the enclosure, and a continuous flow may be provided. The one or more sensors 310 may be further provided to ensure exhaust (e.g., ventilation air) is flowing, as well as for hydrogen detection. Accordingly, the controller 148 of FIG. 1 may provide or receive feedback from the one or more sensors 310 of FIG. 4 to ensure that the area of the end station 106 is not being filled with hydrogen gas. The controller 148, for example, may shut down the ion implantation system 100 if hydrogen gas exceeds a safe level.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplified embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A gas generation system for an ion implantation system, wherein the gas generation system comprises:
    an end station;
    a chuck configured to support a workpiece in the end station for ion implantation thereto;
    a hydrogen generator comprising one or more electrolysis cells configured to selectively generate hydrogen gas from water, wherein the hydrogen generator is positioned within the end station; and
    a delivery system comprising a conduit fluidly coupled to the hydrogen generator and the chuck and configured to selectively provide the hydrogen gas to the chuck.

2. The gas generation system of claim 1, wherein the chuck comprises an electrostatic chuck having one or more thermal features configured to maintain a predetermined temperature of the workpiece, wherein the electrostatic chuck is configured to provide the hydrogen gas to a backside of the workpiece and conduct heat between the one or more thermal features and the workpiece.

3. The gas generation system of claim 1, further comprising an enclosure positioned within the end station and generally enclosing the hydrogen generator.

4. The gas generation system of claim 3, further comprising one or more sensors, wherein the one or more sensors comprise a hydrogen sensor configured to detect a presence of the hydrogen gas within the enclosure.

5. The gas generation system of claim 4, wherein the hydrogen sensor is configured to detect an elevated presence of the hydrogen gas that rises above a predetermined threshold value.

6. The gas generation system of claim 4, further comprising a controller configured to selectively control the hydrogen generator based at least in part, on the detection of the presence of the hydrogen gas within the enclosure.

7. The gas generation system of claim 3, further comprising an exhaust system configured to fluidly interface with the enclosure.

8. The gas generation system of claim 7, wherein the exhaust system is configured to selectively or continuously pass air through the enclosure to generally prevent a build-up of the hydrogen gas within the enclosure.

9. The gas generation system of claim 7, further comprising a purge gas system configured to fluidly interface with the enclosure.

10. The gas generation system of claim 9, wherein the purge gas system is configured to provide a dilutant gas to the enclosure.

11. The gas generation system of claim 10, wherein the dilutant gas comprises one or more nitrogen, air, and a non-flammable gas.

12. The gas generation system of claim 9, wherein the purge gas system is configured to dilute a concentration of the hydrogen gas to below an explosive level.

13. The gas generation system of claim 9, further comprising an interlock system configured to control one or more of the hydrogen generator, delivery system, purge gas system, and exhaust system to mitigate hydrogen release.

14. The gas generation system of claim 13, further comprising one or more sensors, wherein the control via the interlock system is based, at least in part, on a signal from the one or more sensors.

15. The gas generation system of claim 13, wherein the interlock system comprises one or more automated valves, switches, or other interlocks.

16. The gas generation system of claim 13, further comprising one or more sensors, wherein the interlock system comprises one or more of a hardware system and a software control system configured to monitor a concentration of the hydrogen gas from a signal from the one or more sensors.

17. The gas generation system of claim 16, wherein the interlock system is configured to perform one or more of a shut down of the generation of hydrogen by the hydrogen generator, an opening of the exhaust system, an opening of the purge gas system, and a provision of a signal to a controller indicative of a hydrogen release when the concentration of the hydrogen gas exceeds a predetermined threshold value.

18. An ion implantation system comprising:
    an ion source configured to form an ion beam;
    a beamline assembly configured to selectively transport the ion beam;
    an end station configured to accept the ion beam for implantation of ions into a workpiece;
    a chuck configured to support the workpiece in the end station; and
    a hydrogen gas generation system comprising:
        an enclosure positioned within the end station;
        a hydrogen gas generator comprising one or more electrolysis cells configured to selectively generate hydrogen gas from water, wherein the hydrogen gas generator is positioned within the enclosure; and a delivery system comprising a conduit fluidly coupling the hydrogen gas generator and the chuck and selectively provide the hydrogen gas to the chuck.

19. The ion implantation system of claim 18, wherein the chuck comprises an electrostatic chuck, and wherein the hydrogen gas generation system further comprises:

a purge gas system configured to provide a purge gas to the enclosure; and an exhaust gas system configured to selectively remove the purge gas from the enclosure.

20. The gas generation system of claim 6, wherein the hydrogen generator comprises a reservoir, and wherein the controller is further configured to selectively limit a volumetric capacity and flow of the hydrogen gas to the chuck based on a power supplied to the hydrogen generator.

* * * * *